United States Patent
Kim et al.

(10) Patent No.: US 10,241,420 B2
(45) Date of Patent: Mar. 26, 2019

(54) POSITION ADJUSTING UNIT OF OPTICAL ELEMENT AND MASKLESS EXPOSURE APPARATUS INCLUDING THE SAME

(71) Applicant: Samsung Electronics Co., Ltd., Suwon-si, Gyeonggi-do (KR)

(72) Inventors: Tae-Hyun Kim, Seongnam-si (KR); Sang Woo Bae, Seoul (KR); Sang Don Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/809,293

(22) Filed: Nov. 10, 2017

(65) Prior Publication Data

US 2018/0164687 A1    Jun. 14, 2018

(30) Foreign Application Priority Data

Dec. 13, 2016 (KR) .................. 10-2016-0169935

(51) Int. Cl.
  *G03B 27/54* (2006.01)
  *G03F 7/20* (2006.01)
  *G02B 3/00* (2006.01)

(52) U.S. Cl.
  CPC ....... *G03F 7/70825* (2013.01); *G02B 3/0006* (2013.01); *G03F 7/20* (2013.01); *G03F 7/70* (2013.01); *G03F 7/70141* (2013.01); *G03F 7/70258* (2013.01); *G03F 7/70316* (2013.01); *G02B 3/0056* (2013.01)

(58) Field of Classification Search
  CPC ..... G02B 3/0006; G03F 7/201; G03F 7/2008; G03F 7/2051; G03F 7/70075; G03F 7/70083; G03F 7/70141; G03F 7/7015; G03F 7/702; G03F 7/70208; G03F 7/70258; G03F 7/70266; G03F 7/70275; G03F 7/70291; G03F 7/70283; G03F 7/70316;
  (Continued)

(56) References Cited

U.S. PATENT DOCUMENTS

| | | | |
|---|---|---|---|
| 4,453,812 A | * | 6/1984 | Suzuki ..................... G03B 3/10 396/129 |
| 7,764,447 B2 | | 7/2010 | Shibazaki |

(Continued)

FOREIGN PATENT DOCUMENTS

| KR | 10-0775796 B1 | 11/2007 |
|---|---|---|
| KR | 10-0850652 B1 | 8/2008 |

(Continued)

*Primary Examiner* — Christina A Riddle
(74) *Attorney, Agent, or Firm* — Harness, Dickey & Pierce, P.L.C.

(57) ABSTRACT

A position adjusting unit according to some example embodiments includes a base; a mounting part, a driving unit, and a locking part on the base. The mounting part may be movably installed on the base and configured to have an optical element mounted thereto. The driving unit may include a plurality of actuators connected between the base and the mounting part. The driving unit may be configured to move the mounting part with respect to the base. The locking part may be configured to provide a fixing force for fixing a position of the mounting part. The locking part may be configured to release the fixing force when electricity is supplied to the locking part.

19 Claims, 12 Drawing Sheets

(58) Field of Classification Search
CPC .. G03F 7/70383; G03F 7/708; G03F 7/70825; G03F 7/70833; G03F 7/70758
USPC ............... 355/52, 53, 55, 67–71, 72, 75, 77; 250/492.1, 492.2, 492.22, 548; 359/871–872, 877, 390, 811, 814, 822, 359/824
See application file for complete search history.

(56) References Cited

U.S. PATENT DOCUMENTS

| | | |
|---|---|---|
| 7,999,914 B2 | 8/2011 | Van Der Wijst et al. |
| 2004/0189970 A1* | 9/2004 | Takada ................... G03B 27/54 355/67 |
| 2008/0218722 A1* | 9/2008 | Van Der Wijst .... G03F 7/70266 355/67 |

FOREIGN PATENT DOCUMENTS

| | | |
|---|---|---|
| KR | 10-2011-0088741 A | 8/2011 |
| KR | 10-2012-0044631 A | 5/2012 |
| KR | 10-1624856 B1 | 5/2016 |

* cited by examiner

POSITION ADJUSTING UNIT OF OPTICAL ELEMENT AND MASKLESS EXPOSURE APPARATUS INCLUDING THE SAME

CROSS-REFERENCE TO RELATED APPLICATION

This application claims priority to and the benefit of Korean Patent Application No. 10-2016-0169935 filed in the Korean Intellectual Property Office on Dec. 13, 2016, the entire contents of which are incorporated herein by reference.

BACKGROUND

(a) Field

The present disclosure relates to a position adjusting unit of an optical element and a maskless exposure apparatus including the same.

(b) Description of Related Art

In general, a method of forming a pattern in a substrate or a semiconductor wafer (hereinafter, collectively referred to as a "substrate") configuring a display panel is a method of first applying a pattern material onto a substrate, selectively exposing the pattern material by using a photomask, and selectively removing a pattern material portion or other portions, of which a chemical property is changed, to form a pattern.

However, the substrate is gradually enlarged and the pattern becomes precise, so that a maskless exposure apparatus, which forms a desired pattern on the substrate without using a photomask, is used. The maskless exposure has various features: it is not necessary to manufacture a mask; expenses for cleaning and storing a mask are not required; and it is not necessary to replace the mask due to damage to the mask.

A position adjusting unit of an optical element including a lens in the maskless exposure apparatus in the related art manually adjusts the optical element and then fixes a position of the optical element by using a screw engagement, an adhesive, and the like. The manual adjustment has a problem in that it is required to obtain a sufficient space within the exposure apparatus to which an operator is accessible. In order to solve the problem, there is an effort to solve the space securing problem by applying an automatic adjusting unit.

However, the automatic adjusting unit, which automatically adjusts a position of the optical element, adjusts a position of the optical element by using a driving means, and then fixes the optical element by using stop force of the driving means itself. In this case, a high-priced apparatus including a special driving means and the plurality of electronic control units needs to be used, and a thermal transformation problem by a heating problem by power may be generated. Further, when the power supply is removed in order to solve the heating problem, it is impossible to maintain a stable position fixed state of the optical element.

The above information disclosed in this Background section is only for enhancement of understanding of inventive concepts only; therefore, it may contain information that does not form prior art.

SUMMARY

Inventive concepts relate to a position adjusting unit configured to adjust a position of an optical element and then stably fixes the adjusted position.

Inventive concepts also relate to a maskless exposure apparatus, which is capable of easily aligning optical elements.

According to some example embodiments of inventive concepts, a position adjusting unit may include a base, a mounting part movably installed on the base, a driving unit, and a locking part. The mounting part may be configured to have an optical element mounted thereto. The driving unit may include a plurality of actuators connected between the base and the mounting part. The driving unit may be configured to move the mounting part with respect to the base. The locking part may be on the base. The locking part may be configured to provide a fixing force for fixing a position of the mounting part. The locking part may be configured to release the fixing force when electricity is supplied to the locking part.

According to some example embodiments of inventive concepts, a maskless exposure apparatus may include a light modulation device configured to modulate light irradiated from a light source, a plurality of lenses, a micro-lens array, and a position adjusting unit. The light modulation device may include a plurality of micro mirrors. The plurality of lenses may be configured to transmit the light to irradiate the light to a substrate. The micro-lens array may be between the plurality of lenses. The micro-lens array may include a plurality of micro-lenses corresponding to the plurality of micro mirrors, respectively. The position adjusting unit may be configured to adjust a position of at least one of the plurality of lenses, the light modulation device, and the micro-lens array. The position adjusting unit may include a mounting part, a driving unit, and a locking part. The mounting may part be configured to have one of the plurality of lenses, the light modulation device, and the micro-lens array mount thereto. The driving unit may include a plurality of actuators and may be configured to shift the mounting part. The locking part may be configured to apply a fixing force for fixing a position of the mounting part. The locking part may be configured to release the fixing force when electricity is supplied to the locking part.

According to some example embodiments of inventive concepts, a position adjusting unit, may include a base defining a hole, a mounting part configured to be movable on the base and mounting part including an opening over the hole of the base to allow light to pass through the opening of the mounting part and the hole of the base, a driving unit including a plurality of actuators connected to the base and the mounting part, and a locking part arranged between a part the base and a portion of the mounting part. The mounting part may be configured to have an optical element mounted thereto such that the mounting part positions the optical element over the hole of the base and the opening of the mounting part. The driving unit may be configured to move the mounting part with respect to the base. The locking part may be configured to apply a fixing force to the mounting part in a power-off state, and the locking part may be configured to release the fixing force to the mounting part when electricity is supplied to the locking part.

According to some example embodiments of inventive concepts, it is possible to save space and cost by using the piezo actuator and the electro-permanent magnet, and even though power is removed, it is possible to stably fix an optical element.

Further, even though power is removed, it is possible to stably fix a position of an optical element, so that it is possible to remove power after an alignment operation of the optical element.

BRIEF DESCRIPTION OF THE DRAWINGS

Other features and effects will be understood by those of ordinary skill in the art by reference to the following drawings.

DETAILED DESCRIPTION

Hereinafter, a maskless exposure apparatus according to some example embodiments of the present closure will be described with reference to the drawings.

Figure 1:
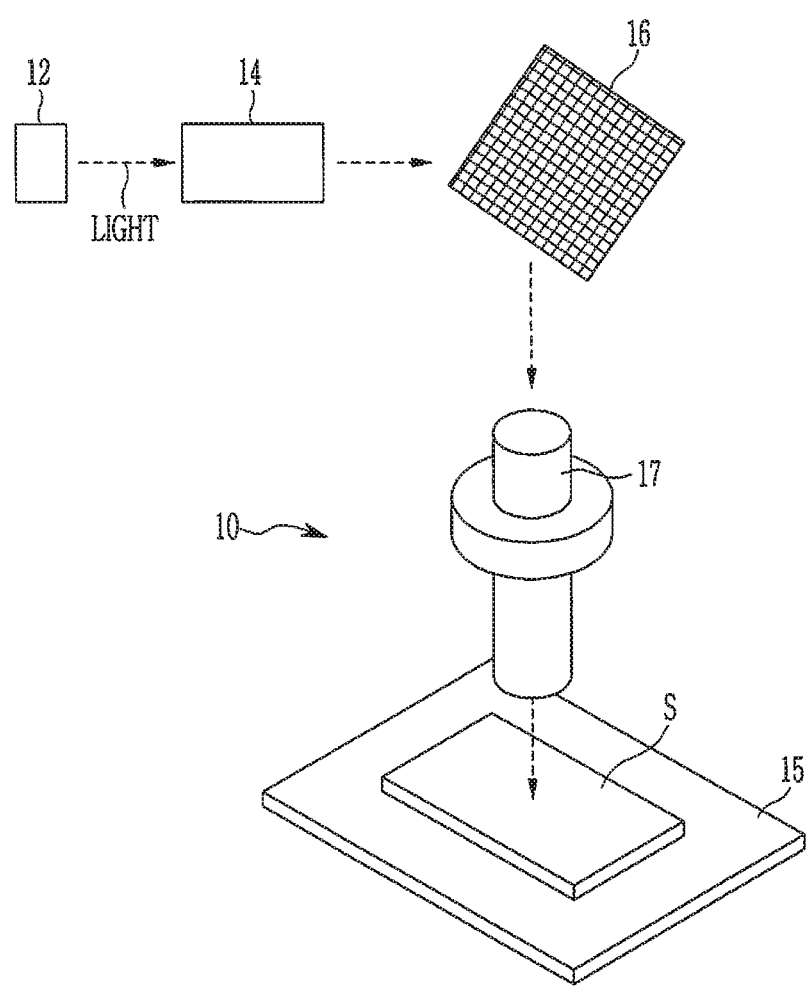
FIG. 1 is a perspective view illustrating a maskless exposure apparatus according to some example embodiments.

FIG. 1 is a perspective view illustrating a maskless exposure apparatus according to some example embodiments.

Referring to FIG. 1, a maskless exposure apparatus 10 may include a light source 12 generating light, a light correcting unit 14 adjusting illuminance of the light source, a light modulation device 16 modulating light to a desired (and/or alternatively predetermined) pattern, and a projection optical unit 17 emitting light onto a substrate S fixed to a stage 15.

The light source 12 is configured to emit light for exposure and may generate a beam. The light source 12 may be embodied as a laser. The light emitted from the light source 12 is output onto the substrate S via the light correcting unit 14, the light modulation device 16, and the projection optical unit 17.

The light correcting unit 14 may correct the light emitted from the light source 12 to have uniform illuminance. The light correcting unit 14 may include a collimator lens and/or other suitable optical structures, but is not limited thereto.

The light modulation device 16 may include a spatial light modulator (SLM) which is capable of spatially modulating light. For example, as the light modulation device 16, a digital micro-mirror device (DMD) in a type of a micro electro mechanical systems (MEMS), a two-dimensional grating light valve (GLV), an electrooptic device using lead zirconate titanate (PLZT) that is light transmissive ceramic, and a ferroelectric liquid crystal (FLC) may be used. Hereinafter, for convenience of the description, a non-limiting example be described by using the light modulation device 16 formed of the DMD.

Figure 2:
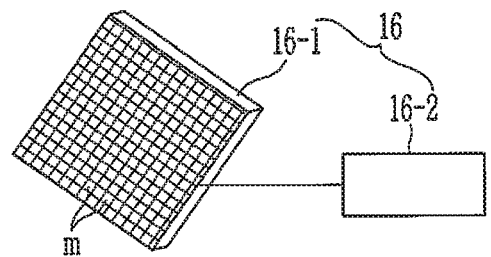
FIG. 2 is an enlarged view of an example of the light modulation device of FIG. 1.

FIG. 2 is an enlarged view of an example of the light modulation device of FIG. 1.

Referring to FIG. 2, the light modulation device 16 may include a plurality of micro-mirrors m for reflecting light provided from the light correcting unit 14 with a desired (and/or alternatively predetermined) angle, and a pattern generating unit 16-2 electrically connected to the micro-mirrors m. The micro-mirrors m may be disposed on a memory cell 16-1. For example, the micro-mirrors m may be aligned in two directions which are vertical to each other. That is, the micro-mirrors m may be aligned in a matrix form including x rows and y columns. The micro-mirrors m may be individually controlled by the pattern generating unit 16-2. The pattern generating unit 16-2 reflects and transmits desired light to the projection optical unit 17 by differently controlling an angle of each micro-mirror m based on a control signal generated according to pattern data, and transmits other light at a different angle and limits and/or blocks the light.

For example, when the control signal is recorded in the memory cell 16-1 of the light modulation device 16 formed of the DMD, the micro-mirror m is inclined within a range of a desired (and/or alternatively predetermined) angle based on a diagonal line. The control of on/off of each micro-mirror m may be controlled by a separate control unit (not illustrated). The light reflected by the on-state micro-mirror exposes an exposure target (for example, photoresist (PR)) on the substrate S, and the light reflected by the off-state micro-mirror does not expose the exposure target on the substrate S.

Figure 3:
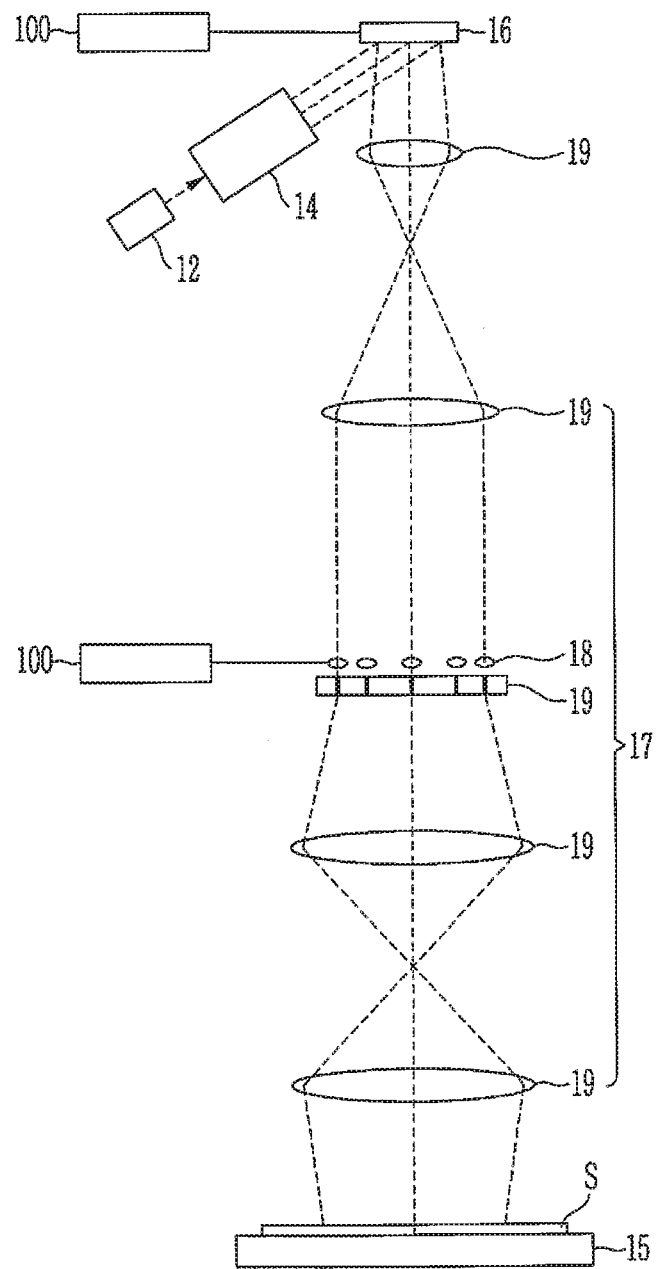
FIG. 3 is a diagram illustrating the maskless exposure apparatus according to some example embodiments.

FIG. 3 is a diagram illustrating the maskless exposure apparatus according to some example embodiments.

Referring to FIG. 3, the projection optical unit 17 may include the plurality of lenses 19, and micro-lens arrays (MLA) 18 may be disposed between the plurality of lenses 19. Here, the plurality of lenses 19 is defined as a concept including all of the optical elements configuring the projection optical unit 17, except for the micro-lens array 18, as well as the optical lens.

The micro-lens array 18 may include the plurality of micro-lenses corresponding to the number of micro-mirrors m included in the light modulation device 16. For example, when the light modulation device 16 includes the micro-mirrors m arranged in a matrix shape of 800×400, the micro-lens array 18 may include the micro-lenses arranged in a matrix shape of 800×400 in response to the micro-mirrors m.

In this case, in order to improve exposure resolution and accurately perform the exposure, the positions of the light modulation device 16 and the micro-lens array 18 need to be accurately aligned, so that light modulated in each pixel of the light modulation device 16 needs to be matched accurately one to one to each micro-lens of the micro-lens array 18. However, by the reason of thermal expansion by heating and the like, each apparatus may be axially distorted, and dislocation may be generated when the light modulation device 16 is replaced. Accordingly, each of the beams reflected from the light modulation device 16 is not accurately matched with each micro-lens of the micro-lens array 18, so that a distortion of a spot beam shape, dislocation of a focal position, cross-talk, resolution deterioration, and the like are generated, thereby failing to accurately perform the exposure.

Figure 4:
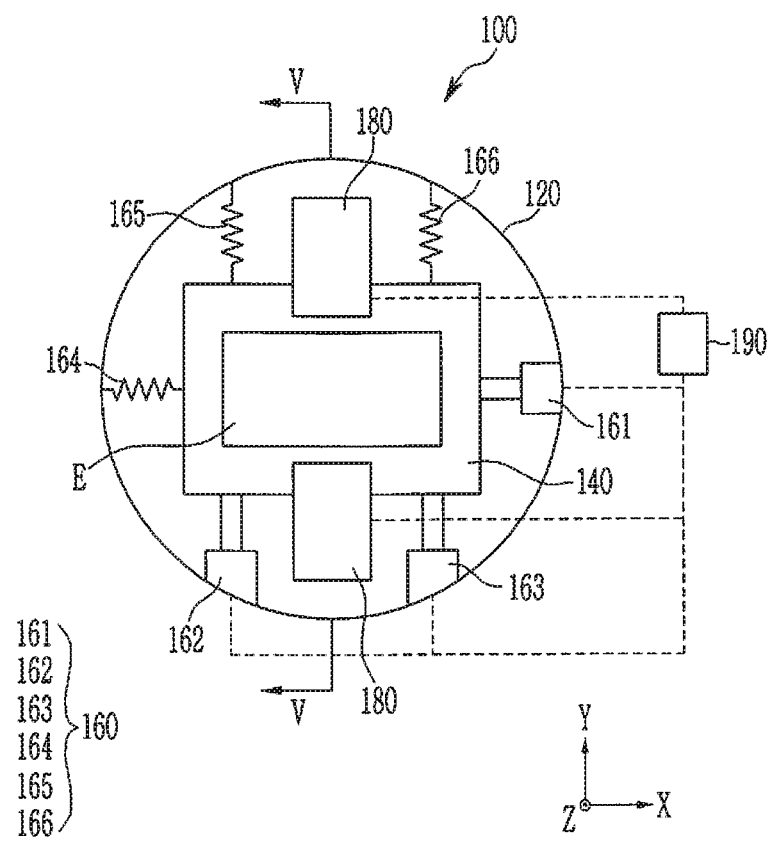
FIG. 4 is a top plan view illustrating a position adjusting unit according to some example embodiments.

As illustrated in FIG. 4, the exposure apparatus according to some example embodiments includes the position adjusting unit 100.

In FIG. 4, the position adjusting unit 100 is connected to the light modulation device 16 and the micro-lens array 18, but this is for illustrative, and the position adjusting unit 100 may be connected to at least one of the light modulation device 16, the micro-lens array 18, and the plurality of lenses configuring the projection optical unit 17, thereby adjusting a position of the optical element connected to the position adjusting unit 100.

That is, the position adjusting unit 100 is a configuration for adjusting the alignment of the plurality of lenses 19, the light modulation device 16, and the micro-lens array 18 by adjusting the position of at least one of the plurality of lenses 19, the light modulation device 16, and the micro-lens array 18.

Hereinafter, an example of the position adjusting unit 100 configuring the exposure apparatus according to some example embodiments will be described in detail.

Figure 5:
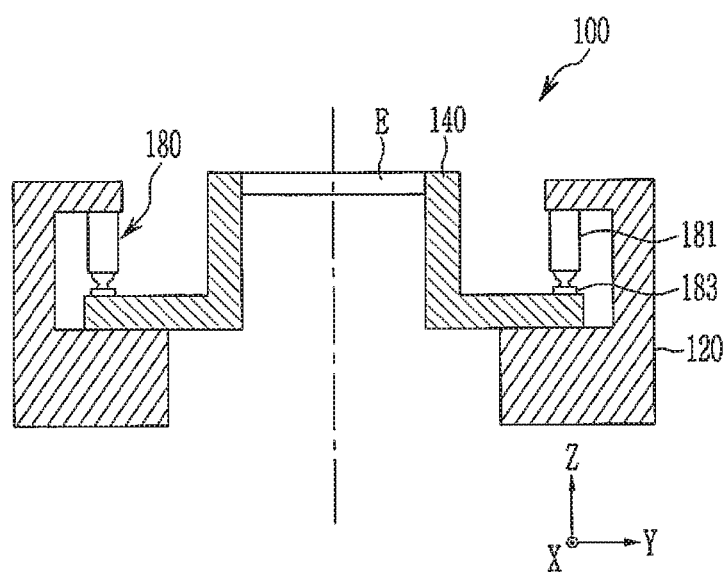
FIG. 5 is a cross-sectional view taken along line V-V of FIG. 4.

FIG. 4 is a top plan view illustrating the position adjusting unit according to some example embodiments, and FIG. 5 is a cross-sectional view taken along line V-V of FIG. 4.

The position adjusting unit 100 may include a base 120, a mounting part 140, a driving unit 160, and a locking part 180.

The base 120 is a part, which serves as a body of the position adjusting unit 100, and a part, on which the mounting part 140, the driving unit 160, and the locking part 180 are installed, or by which the mounting part 140, the driving unit 160, and the locking part 180 are supported. The base 120 has one flat surface, on which the mounting part 140 is positioned, so that the base 120 may have a contact surface which is in contact with the mounting part 140. For example, the base 120 may generally be formed in a disk shape, and may be formed with a hole at a center thereof so as to allow light to pass through. Further, although not illustrated in the drawing, the base 120 may be configured to be supported by separate equipment and may be position-fixed.

The mounting part 140 may be configured to mount an optical element E, for example, the plurality of lenses, the optical modulation device, and the micro-lens array, of which a position is to be adjusted. Hereinafter, for convenience of the description, an adjusted article mounted on the mounting part 140 may be collectively referred to as the "optical element".

A mounting means, on which the optical element E is mountable, may be provided in the mounting part 140. For example, the mounting part 140 may include a fixing part for fixing the optical element E by using a fastening member, such as an adhesives or a bolt, and the optical element E may be fixed to the mounting part 140 through the fastening member. Further, since light may pass through the optical element E mounted in the mounting part 140, the mounting part 140 may define an opening and the opening of the mounting part may be positioned over the hole of the base 120. For example, the mounting part 140 may be a ring form, of which a center is hollow, for example, a quadrangular ring shape as illustrated in FIG. 4.

According to some example embodiments, the mounting part 140 may be installed to be movable on the base 120. For example, as described above, one surface of the base 120 is formed to be flat, and the mounting part 140 may be disposed on the flat surface of the base 120 in the contact state. In this case, one surface of the mounting part 140, which is in contact with the base 120, may also be formed to be flat, and the mounting part 140 may be shifted on the one surface of the base 120 while maintaining a surface contact state. For example, the mounting part 140 may be configured to be triple axially driven, and this will be described below.

The driving unit 160 is a configuration for shifting the mounting part 140, and may include a plurality of actuators 161, 162, and 163 connected between the base 120 and the mounting part 140. The position of the optical element mounted on the mounting part 140 may be adjusted by shifting the mounting part 140 with respect to the base 120 by using the plurality of actuators 161, 162, and 163. Further, as described above, the mounting part 140 may be shifted on one plane while maintaining a surface contact state with the base 120.

Referring to FIG. 4, the driving unit 160 may include the first to third actuators 161, 162, and 163, and include first to third actuators (e.g., springs) 164, 165, and 166 corresponding to the first to third actuators 161, 162, and 163, respectively. The first to third actuators 161, 162, 163, may include electric motors, pneumatic actuators, actuators with piston and/or valves), springs, or other suitable actuators. The first to third actuators 161, 162, and 163 provide driving force for shifting the mounting part 140, and the first to third actuators (e.g., springs) 164, 165, and 166 may provide pre-load to the first to third actuators 161, 162, and 163 corresponding to the first to third actuators (e.g., springs) 164, 165, and 166, respectively. One sides of all of the first to third actuators 161, 162, and 163 and the first to third actuators (e.g., springs) 164, 165, and 166 may be connected to the mounting part 140, and the other sides thereof may be supported to the base 120. The first actuator 161 may shift the mounting part 140 in an x-axis direction, and the second and third actuators 162 and 163 may shift the mounting part 140 in a y-axis direction. Further, the mounting part 140 may also be rotated based on a z-axis direction by driving each of the second and third actuators 162 and 163 or driving the second and third actuators 162 and 163 in opposite directions. That is, the mounting part 140 may perform a translation motion in the x-axis and y-axis directions and a rotary motion based on the z-axis direction by the driving unit 160. In this case, as illustrated in FIG. 4, the first to third actuators 161, 162, and 163 may be driven by receiving electricity from a power supply unit 190. The power supply unit 190 may include a circuit and/or switches for controlling the delivery of electrical power to the actuators in the driving unit. However, the configuration of the driving unit 160 is for illustrative, and the driving unit 160 may be formed of various driving means, not the first to third actuators 161, 162, and 163 and the first to third actuators (e.g., springs) 164, 165, and 166.

The position adjusting unit 100 according to some example embodiments may adjust a position of the optical element E using the driving unit 160, and may include the locking part 180 for fixing the adjusted position of the optical element E.

The locking part 180 is a part for fixing a position of the mounting part 140, and according to some example embodiments, the locking part 180 may be configured so that fixing force, which fixes the position of the mounting part 140, is released by the supply of electricity. Accordingly, even though power is removed, the position of the optical element may be stably fixed, so that it is possible to solve a thermal expansion problem by heating. Hereinafter, the configuration of the locking part 180 will be described in detail.

Referring to FIG. 5, the locking part 180 may be disposed between the base 120 and the mounting part 140 and may fix the position of the mounting part 140 to the base 120. According to some example embodiments, the locking part 180 may include a piezo actuator 181. The piezo actuator 181 is an actuator using a piezoelectric material, and uses an inverse piezoelectric effect, in which a piezoelectric material is expanded and contracted when a voltage is applied. In some example embodiments, the case where the piezoelectric material of the piezo actuator 181 is contracted when a voltage is applied will be described as an example.

Referring to FIG. 5, one end of the piezo actuator 181 is supported to (and/or connected to) the base 120 and the other end of the piezo actuator 181 is in contact with the mounting part 140, so that the piezo actuator 181 may be disposed in a state of pressing the mounting part 140 toward the base 120. For example, the piezo actuator 181 may be disposed so as to be driven in the z-axis direction. Further, the other end of the piezo actuator 181 may be provided with a pressing member 183, and the pressing member 183 is a part for preventing a transformation or damage of the pressed mounting part 140, and may be formed with a wide contact area or may be formed of a shock absorbable material. In this case, when a voltage is applied to the piezo actuator 181, the inside piezoelectric material may be contracted and the other end of the piezo actuator 181 may be spaced apart from the mounting part 140. Further, when the supply of electricity to the piezo actuator 181 is released, the piezoelectric material inside the piezo actuator 181 is expanded to an original state, so that the other end of the piezo actuator 181 or the pressing member 183 may press the mounting part 140 toward the base 120. Accordingly, the locking part 180 may stably fix the position of the mounting part 140, and even in the state where the power is blocked, the locking part 180 may stably maintain the fixed position of the optical element. In the meantime, it is not necessary to supply electricity to the driving unit 160 after shifting the mounting part 140, and in this case, the supply of electricity to the locking part 180 is released at the same time, thereby maintaining the fixed state of the mounting part 140. That is, according to some example embodiments, the supply of electricity from the power supply unit 190 to the driving unit 160 and the locking part 180 may be simultaneously released. Further, when the driving unit 160 is driven for shifting the mounting part 140, electricity may be supplied to the driving unit 160, and in this case, the fixed state of the mounting part 140 may be released by simultaneously supplying electricity to the locking part 180, thereby easily shifting the mounting part 140. That is, according to some example embodiments, electricity from the power supply unit 90 may be simultaneously supplied to the driving unit 160 and the locking part 180.

However, the locking part 180 including the piezo actuator 181 may be formed in various forms, and hereinafter, modified examples of the locking part 180 will be described.

Figure 6A:
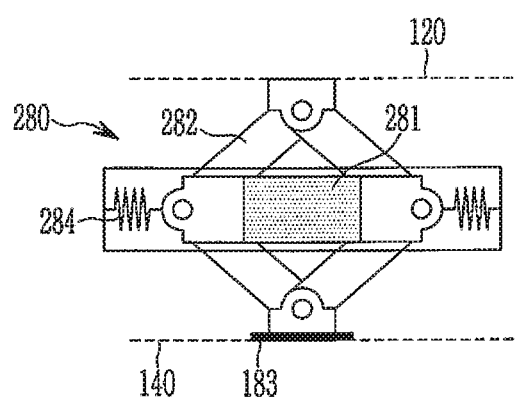
FIGS. 6(a), 6(b), 7(a), and 7(b) are diagrams illustrating various examples of a locking part.
Figure 6B:
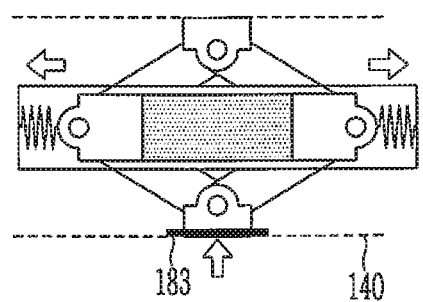
Figure 7A:
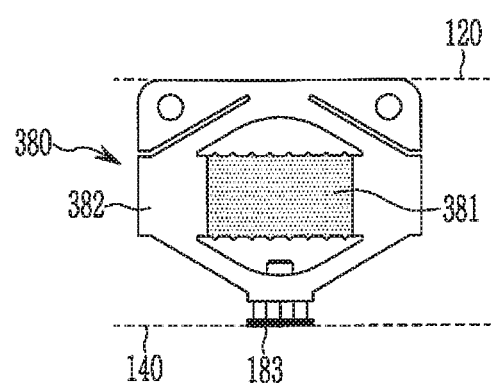
Figure 7B:
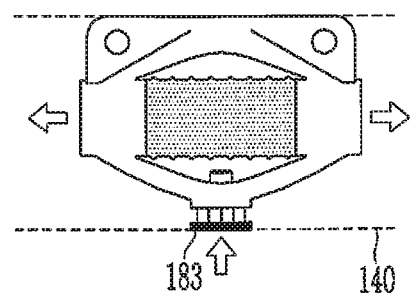

FIGS. 6(a), 6(b), 7(a), and 7(b) are diagrams illustrating various modified examples of the locking part, and for convenience of the description, a modified example illustrated in FIGS. 6 (a) and 6(b) is defined as a first modified example, and a modified example illustrated in FIGS. 7(a) and 7(b) is defined as a second modified example.

Referring to FIGS. 6(a) AND 6(b), the locking part 280 according to the first modified example may include a piezo actuator 281 and a link member 282. The case where the piezo actuator 281 in the locking part 280 according to the first modified example is driven to be contracted and expanded in left and right directions (the x-axis direction based on FIG. 5) based on FIGS. 6(a) AND 6(b) according to the supply of electricity will be described as an example. In the meantime, in FIGS. 6(a) and 6(b), the piezo actuator 281 is defined as a meaning including a piezoelectric material itself, as well as an actuator. Referring to FIGS. 6(a) and 6(b), the link member 282 may be connected to both ends of the piezo actuator 281 through a plurality of hinges to change a driving direction of the piezo actuator 281. For example, the driving direction in the left and right directions of the piezo actuator 281 may be changed to up and down directions. Further, the link member 282 may also change a size of displacement of the piezo actuator 281, as well as a direction of displacement of the piezo actuator 281, so that the link member 282 may amplify driving force of the piezo actuator 281. The link member may include a metal or non-metal part for connecting to both ends of the piezo actuator 281 through hinges. In the meantime, an elastic member 284 for providing pre-load may be connected to the link member 282 to enable the link member 282 to be stably operated. The elastic member 284 may include a spring.

FIG. 6(a) illustrates the state where the supply of electricity to the piezo actuator 281 is released, and FIG. 6B illustrates the state where electricity is supplied to the piezo actuator 281. Referring to FIG. 6(a), when electricity is not supplied to the piezo actuator 281, an upper end of the link member 282 supports the base 120 and a lower end of the link member 282 may maintain a state of pressing the mounting part 140. That is, the locking part 280 provides a fixing force for the mounting part 140. In this case, the pressing member 183 may be provided at the lower end of the link member 282. Referring to FIG. 6(b), when electricity is supplied to the piezo actuator 281, the lower end of the link member 282, which has pressed the mounting part 140, may shift in an up direction and be spaced apart from the mounting part 140. Accordingly, the fixing force for the mounting part 140 provided from the locking part 280 is released.

Referring to FIGS. 7(a) and 7(b), a locking part 380 according to the second modified example may include the piezo actuator 381 and a flexure structure 382 elastically transformed. The case where the piezo actuator 381 in the locking part 380 according to the second modified example is driven to be contracted and expanded in the left and right directions (the x-axis direction based on FIG. 5) based on FIGS. 7(a) and 7(b) according to the supply of electricity will be described as an example. In the meantime, in FIGS. 7(a) and 7(b), the piezo actuator 381 is defined as a meaning including a piezoelectric material itself, as well as an actuator. Referring to FIGS. 7(a) and 7(b), the flexure structure 382 is formed of an elastically transformable material, and may be formed of a metal material. The flexure structure 382 may include a plurality of holes or wrinkles so as to be easily transformed. The flexure structure 382 may be connected to both ends of the piezo actuator 381 to receive driving force of the piezo actuator 381 and change a driving direction of the piezo actuator 381. For example, the flexure structure 382 may change the driving direction in the left and right directions of the piezo actuator 381 to up and down directions. Further, the flexure structure 382 may also change a size of displacement of the piezo actuator 381, as well as a direction of displacement of the piezo actuator 381, so that the flexure structure 382 may amplify driving force of the piezo actuator 381.

FIG. 7(a) illustrates the state where the supply of electricity to the piezo actuator 381 is released, and FIG. 7(b) illustrates the state where electricity is supplied to the piezo actuator 381. Referring to FIG. 7(a), when electricity is not supplied to the piezo actuator 381, an upper end of the flexure structure 382 supports the base 120 and a lower end of the flexure structure 382 may maintain a state of pressing the mounting part 140. That is, the locking part 380 provides a fixing force for the mounting part 140. In this case, the pressing member 183 may be provided at the lower end of the flexure structure 382. Referring to FIG. 7(b), when electricity is supplied to the piezo actuator 381, the lower end of the flexure structure 382, which has pressed the mounting part 140, may shift in an up direction and be spaced apart from the mounting part 140. Accordingly, the fixing force for the mounting part 140 provided from the locking part 380 is released.

As described above, if the fixing force for fixing the mounting part is releasable according to the supply of electricity, the locking part of the position adjusting unit may be formed in various schemes, in addition to the aforementioned scheme.

In the meantime, in the position adjusting unit, the locking part 180 may be implemented to exhibit the same function through other configurations, not the piezo actuator 181. Hereinafter, the piezo actuator 181 descried with reference to FIGS. 8 and 9 may be formed in the forms illustrated in FIGS. 6 and 7 as a matter of course.

Figure 8:
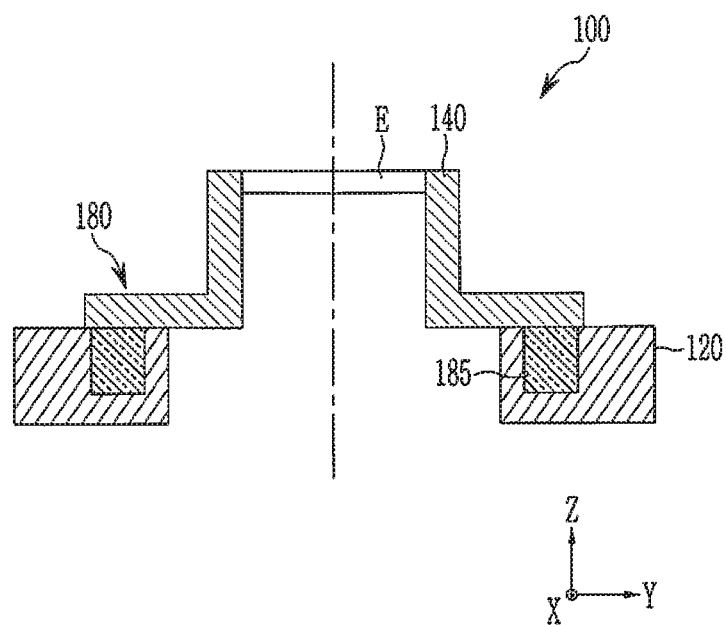
FIG. 8 is a cross-sectional view illustrating a position adjusting unit according to some example embodiments.
Figure 9:
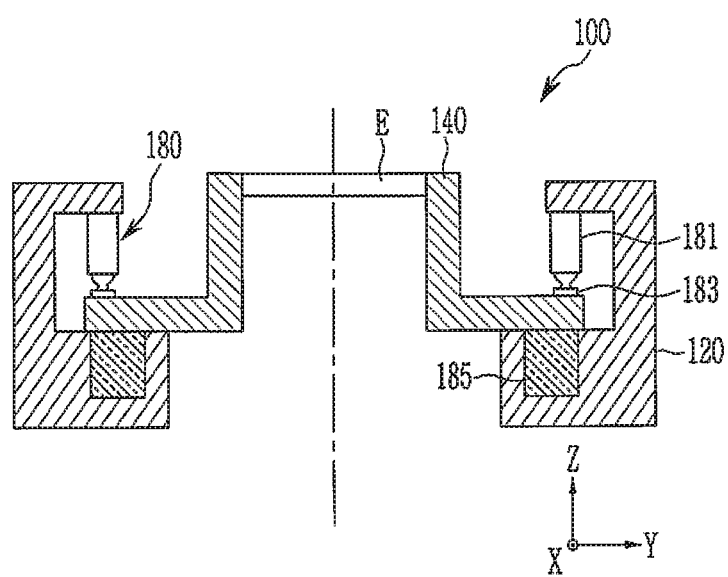
FIG. 9 is a cross-sectional view illustrating a position adjusting unit according to some example embodiments.

FIG. 8 is a cross-sectional view illustrating a position adjusting unit according to some example embodiments, and FIG. 9 is a cross-sectional view illustrating a position adjusting unit according to some example embodiments.

Referring to FIG. 8, a locking part 180 of a position adjusting unit 200 according to some example embodiments may include an electro-permanent magnet 185. In this case, a mounting part 140 may be formed of a magnetic material. Herein, the electro-permanent magnet 185 is a magnet, in which a permanent magnet and an electromagnet are combined, and has an opposite property to that of the electromagnet. That is, the electro-permanent magnet 185 usually has magnetic force like the permanent magnet, but when a current is applied, magnetic force of the electro-permanent magnet 185 disappears. The electro-permanent magnet 185 may be controlled to be on/off through the supply of electricity, so that the electro-permanent magnet 185 is widely used as a holder or a chuck fixing an object, and may be formed by a combination of an AlNiCo magnet and an NdFeB magnet. The electro-permanent magnet is a technology widely known to those skilled in the art, so that a detailed description thereof will be omitted.

Referring to FIG. 8, the electro-permanent magnet 185 may be installed in a base 120, and may be positioned under the mounting part 140 so as to fix a position of the mounting part 140. Accordingly, when electricity is supplied to the electro-permanent magnet 185, magnetic force disappears, so that the position fixed state of the mounting part 140 may be released. Further, when the supply of electricity to the electro-permanent magnet 185 is released, fixing force for fixing the mounting part 140 toward the base 120 is generated by the magnetic force of the electro-permanent magnet 185. Accordingly, the locking part 180 may stably fix the position of the mounting part 140, and even in the state where the power is blocked, the locking part 180 may stably maintain the fixed position of an optical element. In the meantime, it is not necessary to supply electricity to the driving unit 160 after shifting the mounting part 140, and in this case, the supply of electricity to the locking part 180 is released at the same time, thereby maintaining the fixed state of the mounting part 140. That is, as described above, the supply of electricity from a power supply unit 190 to the driving unit 160 and the locking part 180 may be simultaneously released. Further, when the driving unit 160 is driven for shifting the mounting part 140, it is necessary to supply electricity to the driving unit 160, and in this case, the fixed state of the mounting part 140 may be released by simultaneously supplying electricity to the locking part 180, thereby easily shifting the mounting part 140. That is, as described above, electricity from the power supply unit 190 may be simultaneously supplied to the driving unit 160 and the locking part 180.

In the meantime, as illustrated in FIG. 9, the locking part 180 may be formed by a combination of the aforementioned piezo actuator 181 and the electro-permanent magnet 185.

Referring to FIG. 9, a locking part 180 of a position adjusting unit 300 according to some example embodiments may include a piezo actuator 181 and an electro-permanent magnet 185. For example, the electro-permanent magnet 185 is disposed at a lower position of a mounting part 140 and the piezo actuator 181 driven in the z-axis direction is disposed at an upper position of the mounting part 140, thereby more stably fixing a position of the mounting part 140.

Hereinafter, a method of aligning an optical element of a maskless exposure apparatus using the position adjusting unit will be described.

Figure 10:
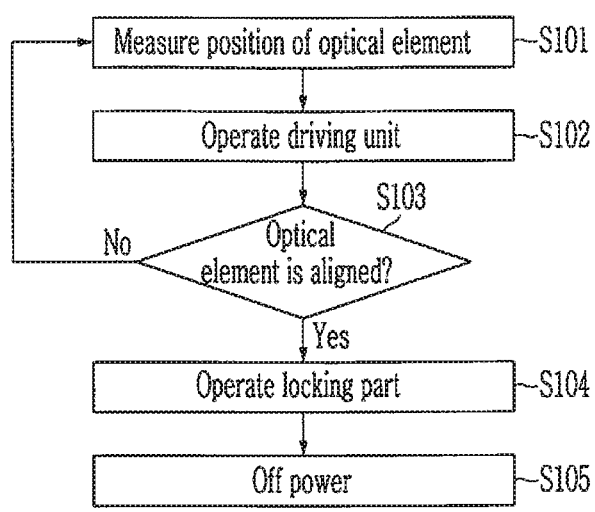
FIG. 10 is a flowchart illustrating a method of aligning an optical element of the maskless exposure apparatus according to some example embodiments.

FIG. 10 is a flowchart illustrating a method of aligning an optical element of the maskless exposure apparatus according to some example embodiments.

Referring to FIG. 10, a position of an adjusted object, for example, the light modulation device 16 or the micro-lens array 18, among the optical elements configuring the maskless exposure apparatus is measured (S101). In this case, the position of the adjusted object may be measured through an image obtained by photographing an image represented on a substrate by using vision equipment, such as a camera, and a displacement value, by which the optical element E deviates from the alignment, may be calculated.

Next, the driving unit 160 is operated (S102). For example, when electricity is supplied from the power supply unit 190 to the plurality of actuators 161, 162, and 163, it is possible to shift the mounting part 140, on which the optical element E is mounted. In this case, the mounting part 140 may be shifted so as to correspond to the displacement value, by which the optical element E deviates from the alignment. In this case, electricity is also supplied to the locking part 180, so that fixing force of the locking part 180 fixing the mounting part 140 may be released. For example, it is possible to simultaneously supply electricity to the driving unit 160 and the locking part 180, and thus, it is possible to simply configure a control method of the position adjusting unit 100.

After the adjustment of the position of the mounting part 140, whether the optical element E is aligned is determined (S103). For example, a displacement value, by which the optical element E deviates from the alignment, may be calculated by using the vision equipment, such as a camera, and whether the displacement value is included within a desired (and/or alternatively predetermined) range may be determined. In this case, when the displacement value, by which the optical element E deviates from the alignment, is not included within the desired (and/or alternatively predetermined) range, it is determined that the optical element E is in a misaligned state, and the position of the mounting part 140 is adjusted again. In this case, the position of the optical element E may also be determined again, or without the position measurement process, the driving unit 160 may be directly operated by using the previously measured displacement value.

In the meantime, when the displacement value, by which the optical element E deviates from the alignment, is included within the desired (and/or alternatively predetermined) range, it is determined that the optical element E is in an aligned state, so that the locking part 180 is operated (S104). For example, the locking part 180 may fix the position of the mounting part 140 by blocking the power supplied to the locking part 180. Even though electricity is not supplied to the locking part 180, the locking part 180 may stably maintain the state of fixing the position of the mounting part 140, so that subsequently power supplied to the position adjusting unit 100 may be blocked (S105). In this case, the power supplied to the position adjusting unit 100 is blocked at the same time when the supply of electricity to the locking part 180 is released for the operation of the locking part 180, so that it is possible to simply configure the control method of the position adjusting unit 100.

As described above, according to some example embodiments, the piezo actuator and the electro-permanent magnet are used, so that it is possible to save a space and costs required for configuring the position adjusting unit of the optical element configuring the maskless exposure apparatus, and even through the supply of electricity to the position adjusting unit is released, it is possible to stably fix the optical element. Accordingly, it is possible to easily align the optical element, and it is possible to clearly solve the problem by heating by removing power supplied to the position adjusting unit even after the alignment operation.

While some example embodiments of inventive concepts have been described, one of ordinary skill in the art would appreciate that variations in form and detail may be without departing from the spirit and scope of the appended claims.

What is claimed is:

1. A position adjusting unit, comprising:
   a base;
   a mounting part movably installed on the base, the mounting part configured to have an optical element mounted thereto;
   a driving unit including a plurality of actuators connected between the base and the mounting part, the driving unit being configured to move the mounting part with respect to the base;
   a locking part on the base, the locking part configured to provide a fixing force for fixing a position of the mounting part, the locking part configured to release the fixing force when electricity is supplied to the locking part; and
   a power supply unit configured to supply electricity to the driving unit and the locking part.

2. The position adjusting unit of claim 1, wherein the locking part includes a piezo actuator.

3. The position adjusting unit of claim 2, wherein
   the locking part further includes a link member and a spring,
   the link member is connected to the piezo actuator,
   the link member is configured to change a driving direction of the piezo actuator, and
   the spring is configured to provide a pre-load to the piezo actuator.

4. The position adjusting unit of claim 2, wherein
   the locking part further includes a structure configured to be elastically transformed,
   the structure includes a plurality of holes or a plurality of wrinkles, and
   the structure connects the base to the piezo actuator.

5. The position adjusting unit of claim 2, wherein
   the locking part further includes a pressing member connected to the piezo actuator, and
   the pressing member is configured to press one side of the mounting part.

6. The position adjusting unit of claim 1, wherein
   the locking part includes an electro-permanent magnet, and
   the mounting part includes a magnetic material.

7. The position adjusting unit of claim 1, wherein
   the base includes a flat surface, and
   the mounting part is configured to be shifted between a state of contacting the flat surface of the base and a state of not contacting the flat surface.

8. The position adjusting unit of claim 1, wherein the driving unit is configured to be driven by electricity.

9. The position adjusting unit of claim 1,
   wherein the power supply unit is at least one of,
   configured to simultaneously supply electricity to the driving unit and the locking part, and
   simultaneously release supplying electricity to the driving unit and the locking part.

10. A maskless exposure apparatus, comprising:
    a light modulation device configured to modulate light irradiated from a light source, the light modulation device including a plurality of micro mirrors;
    a plurality of lenses configured to transmit the light to irradiate the light to a substrate;
    a micro-lens array between the plurality of lenses, the micro-lens array including a plurality of micro-lenses corresponding to the plurality of micro mirrors, respectively; and
    a position adjusting unit configured to adjust a position of at least one of the plurality of lenses, the light modulation device, and the micro-lens array,
    the position adjusting unit including a mounting part, a driving unit, a locking part, and a power supply unit,
    the mounting part being configured to have one of the plurality of lenses, the light modulation device, and the micro-lens array mounted thereto,
    the driving unit including a plurality of actuators and being configured to shift the mounting part,
    the locking part configured to apply a fixing force for fixing a position of the mounting part, the locking part being configured to release the fixing force when electricity is supplied to the locking part, and
    the power supply unit configured to supply electricity to the driving unit and the locking part.

11. The maskless exposure apparatus of claim 10, wherein the locking part includes a piezo actuator.

12. The maskless exposure apparatus of claim 11, wherein the locking part further includes an elastic member connected to the piezo actuator.

13. The maskless exposure apparatus of claim 10, wherein:
    the locking part includes an electro-permanent magnet, and
    the mounting part is formed of a magnetic material.

14. The maskless exposure apparatus of claim 10, wherein the driving unit is configured to be triple-axially driven on one plane.

15. The maskless exposure apparatus of claim 10, wherein
    the mounting part includes a fixing part,
    the power supply unit is configured to supply electricity to the driving unit and the fixing part,
    the driving unit is configured to be driven by electricity, and
    the power supply unit is at least one of configured to simultaneously supply electricity to the driving unit and the fixing part and simultaneously release supplying electricity to the driving unit and the fixing part.

16. A position adjusting unit comprising:
    a base, the base defining a hole;
    a mounting part configured to be movable on the base, the mounting part including an opening over the hole of the base to allow light to pass through the opening of the mounting part and the hole of the base, the mounting part being configured to position an optical element over the hole of the base and the opening of the mounting part;

a driving unit including a plurality of actuators connected to the base and the mounting part, the driving unit being configured to move the mounting part with respect to the base;

a locking part arranged between a part of the base and a portion of the mounting part, the locking part being configured to apply a fixing force to the mounting part in a power-off state, and the locking part being configured to release the fixing force to the mounting part when electricity is supplied to the locking part; and a power supply unit configured to supply electricity to the driving unit and the locking part.

17. The position adjusting unit of claim 16, wherein the locking part includes a piezo actuator.

18. The position adjusting unit of claim 16, wherein the locking part includes an electro-permanent magnet.

19. A maskless exposure apparatus, comprising:
the position adjusting unit of claim 16; and
a light modulation device connected to the position adjusting unit.

* * * * *